United States Patent [19]

Keil et al.

[11] Patent Number: 4,471,494
[45] Date of Patent: Sep. 11, 1984

[54] OPTICAL TRANSMISSION SYSTEM FOR HIGH FREQUENCY DIGITAL SIGNALS

[75] Inventors: Heinrich Keil, Munich; Herwig Trimmel, Puchheim, both of Fed. Rep. of Germany

[73] Assignee: Siemens Aktiengesellschaft, Berlin & Munich, Fed. Rep. of Germany

[21] Appl. No.: 407,586

[22] Filed: Aug. 12, 1982

[30] Foreign Application Priority Data

Sep. 21, 1981 [DE] Fed. Rep. of Germany ....... 3137497

[51] Int. Cl.³ .............................................. H04B 9/00
[52] U.S. Cl. ................................... 455/611; 455/618; 332/7.51
[58] Field of Search ............... 332/7.51; 455/608, 611, 455/609, 618, 615, 613

[56] References Cited

U.S. PATENT DOCUMENTS 4,292,606 9/1981 Trimmel ............................ 332/7.51

FOREIGN PATENT DOCUMENTS 2902789 1/1979 Fed. Rep. of Germany ...... 455/618
2841433 3/1980 Fed. Rep. of Germany .

OTHER PUBLICATIONS

Cochrane et al., "Novel Supervisory Channel for Fibre Optic Transmission Systems", Electronics Letters, vol. 16, No. 16, Jul. 13, 1980, pp. 624–626.

Smith, D. W., "Laser Level Control Circuit for High Bit Rate Systems Using a Slope Detector", Electronics Letters, vol. 14, No. 24, Nov. 23, 1978, pp. 775–776.

Primary Examiner—Joseph A. Orsino, Jr.
Assistant Examiner—Timothy K. Greer
Attorney, Agent, or Firm—Hill, Van Santen, Steadman & Simpson

[57] ABSTRACT

A desire exists in the optical transmission of optical signals to co-transmit a service channel or telemetry signals in the form of an additional low frequency signal over the light conductor, since a remote feed line or a service channel is not always installed parallel to the light conductor length. The requirement exists for the transmission of the additional signal that, in addition to a low additional expense, no disruption of the actual useful signal can occur. To this end, the control signal of a laser diode transmitter is modulated with the signal to be additionally transmitted and this light component is coupled out at the receiving side. The structure is particularly useful in optical transmission systems for very high frequency digital signals with bit rates above 100 Mbit/s.

7 Claims, 10 Drawing Figures

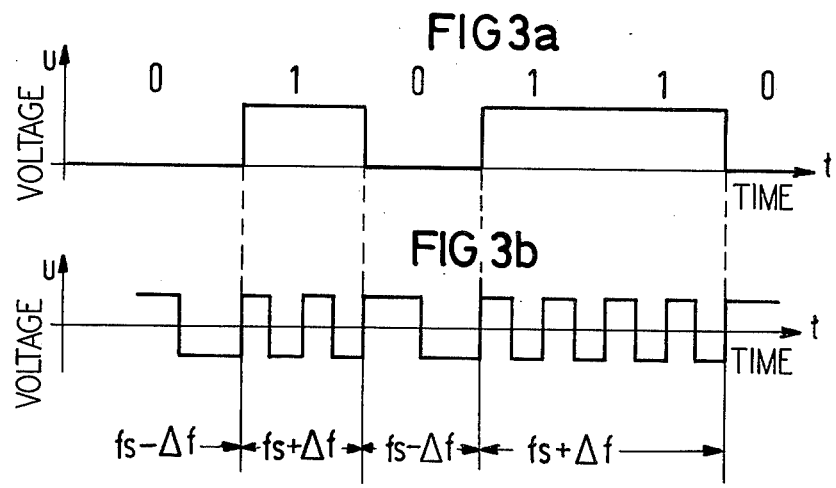
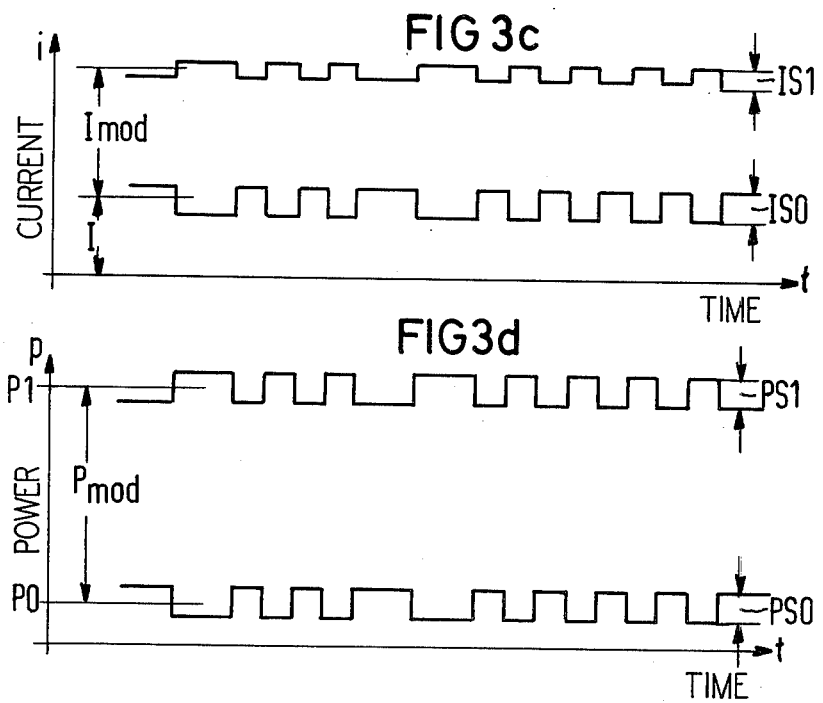

OPTICAL TRANSMISSION SYSTEM FOR HIGH FREQUENCY DIGITAL SIGNALS

BACKGROUND OF THE INVENTION

1. Field of the Invention

The present invention relates to an optical transmission system for high frequency digital signals, and more particularly to such a system in which a laser diode transmitter is controlled by a relatively low frequency control signal having a small amplitude, and in which a receiver contains a light-sensitive component with a following amplifier and a signal processing circuit.

2. Description of the Prior Art

Remotely-fed intermediate stations are inserted at certain spacings in a transmission link into transmission systems for digital signals so that an amplitude and timewise regeneration of the digital signals occurs. Given the use of coaxial cables, the possibility exists of additionally transmitting the remote feed current over the communication cable and, moreover, additional signals such as, for example, signals of a service channel or of an alarm and report channel. Given optical transmission systems, a possibility exists on a case-by-case basis of transmitting such additional signals over an additional remote feed line. In view of a local feed of regenerators for the optical transmission system, however, the case can occur that no remote feed line is provided parallel to the overall optical transmission link. In this case, there is a need for an additional signal path which also proceeds over the optical transmission system and which is of low frequency in comparison to the digital signals.

An optical transmission system is known from "Electronic Letters", July 31, 1980, pp. 624–626, in which an additional channel for the transmission of monitoring information and as a service channel is provided. The transmission of the additional information thereby occurs by direct modulation of the bit rate of the transmitted data signals. The modulation causes an increase of the jitter, i.e. of the phase modulation of the digital signals, which, in conjunction with further disruptive influences under certain conditions, can lead to disruptions in the transmission of the digital signals.

A method for regulating the preconduction current supplied to the laser diodes is known from the German published application No. 28 41 433 in which a periodic oscillation having a relatively low frequency and a low amplitude in comparison to the transmission signal is superposed on the preconduction current. A portion of the light emitted by the laser diode is branched off, the periodic oscillation is regained and, after conversion and comparison to a reference signal, is employed for the regulation of the preconduction current.

A regulation of the modulation current of laser diodes corresponding to the preconduction regulation is known from the German published application No. 28 47 182, which corresponds to U.S. Pat. No. 4,292,606 which is fully incorporated herein by this reference.

A further circuit arrangement for the regulation of the laser threshold is known from the publication "Electronic Letters", Nov. 23, 1978, pp. 775–776, in which at least one small amplitude, low frequency signal is likewise superposed on the laser preconduction current and on the data signal to be transmitted. In this case as well, a portion of the light emitted by the laser diode is picked up by a photo diode, the low frequency signal is regained and, after corresponding conversion is employed for regulating the laser diode preconduction current and for regulating the modulation current. A transmission of the regulation signals over the optical transmission system is not considered in the prior art, particularly in view of the very low amplitude of the regulation signal.

SUMMARY OF THE INVENTION

It is therefore the object of the invention to provide for the construction of a monitoring or service channel which has as little influence as possible on the digital signals to be transmitted and which makes due without the use of additional line devices.

The foregoing object is achieved, according to the present invention, in that, for the transmission of an additional low frequency signal, the control signal of the laser diode transmitter is subjected to a modulation by the signal to be additionally transmitted and in that an outcoupling device for the control signal of the laser diode transmitter and a demodulator connected thereto are provided in the receiver.

It is thereby of particular advantage that the control signals of the laser diode transmitter are coemployed for the transmission of the auxiliary signal and the additionally required expense is therefore relatively slight. Nonetheless, the transmission of the auxiliary signal is independent of the control operations of the laser diode transmitter, so that a falsification of the auxiliary signal due to repetitive errors or actuating signals can be excluded.

In view of the fact that the light pulse level required for the regulation is unchanged, an angular modulation of the control signal of the laser diode transmitter is particularly advantageous; and in addition to frequency modulation, it is particularly pulse duration modulation, pulse phase modulation, pulse frequency modulation and phase shift keying (PSK) which come into consideration as types of modulation. A digital modulation of the control signal can also be advantageous, so that pulse delta modulation can also be employed in addition to pulse code modulation.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 3, which includes FIGS. 3a, 3b, 3c and 3d, is a further pulse diagram relating to the structure of FIG. 1;

FIG. 5, including

DESCRIPTION OF THE PREFERRED EMBODIMENTS

Figure 1:
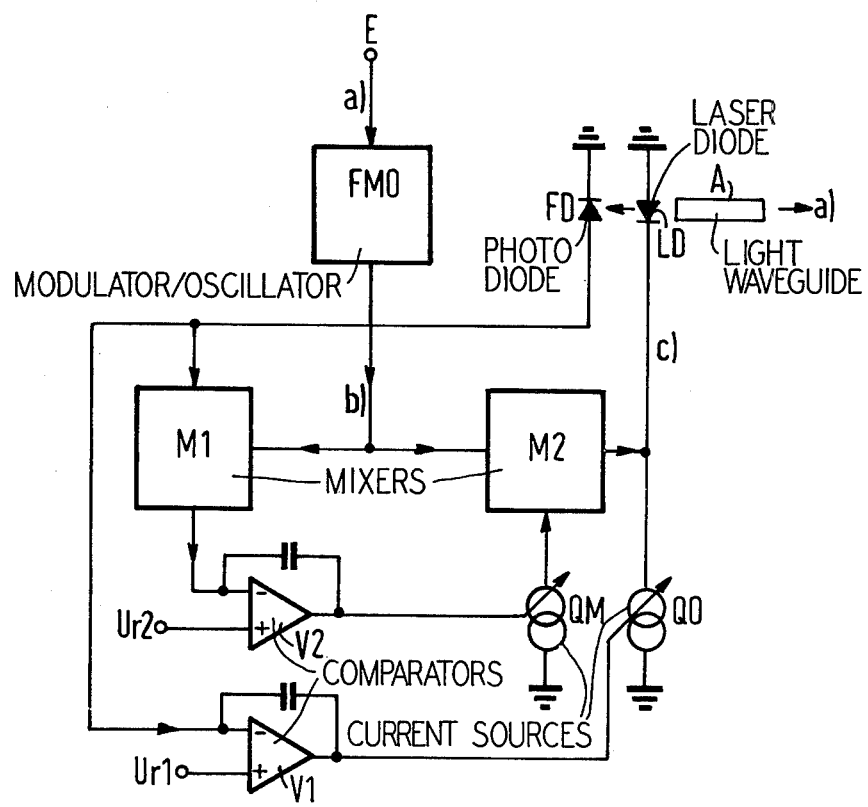
FIG. 1 is a schematic block diagram of a transmitter of an optical transmission system constructed in accordance with the present invention.

A laser transmitter is illustrated in FIG. 1 as comprising two control loops which serve for the regulation of the modulation current and of the laser diode preconduction current. In order to form the control loops, in addition to a light wave guide A which represents the output of the laser transmitter, a photodiode FD is optically coupled to a laser diode LD. After amplification of the photodiode output signal in a standard amplifier (not illustrated on the drawing) the photodiode output signal arrives at an input of a first comparator V1 which is constructed in the manner of a differential amplifier. The output signal of the photodiode is applied to the inverting input (−) of the amplifier, whereas a first reference voltage Ur1 is connected to the non-inverting input (+). The inverting input (−) and the output of the amplifier are capacitively connected to one another and a control input of a current source QO for the laser diode preconduction current is connected to the output. The output of the source QO for the laser diode preconduction current is directly connected to a terminal of the laser diode LD.

A regulation of the mean light power of the laser diode LD occurs by way of the control loop, and fluctuations from the reference value are determined and amplified in the comparator V1 and which readjusts the preconduction current of the laser diode until the reference value is reached.

In order to regulate the modulation current, a second control loop is provided which is likewise connected to the photodiode FD. To this end, a first mixer M1 is provided whose one input is connected to a terminal of the photodiode FD and whose other input is connected to a terminal of a modulator and oscillator FMO. An oscillation which is very low in frequency in comparison to the digital signals is generated by the oscillator and is forwarded to the first mixer M1 as well as to an input of a second mixer M2. The inverting input (−) of a second comparator V2 is connected to the output of the first mixer M1, the comparator V2, analogously to the first comparator V1, being constructed in the form of a differential amplifier with a second reference voltage Ur2 being connected to its non-inverting input (+). The output of the second comparator V2 is connected to the control input of a source QM for the modulation current, the output of the source being connected to a second input of the second mixer M2. The output of the second mixer M2 is connected to the laser diode LD in parallel with the output of the source QO for the laser diode preconduction current.

Figure 2:
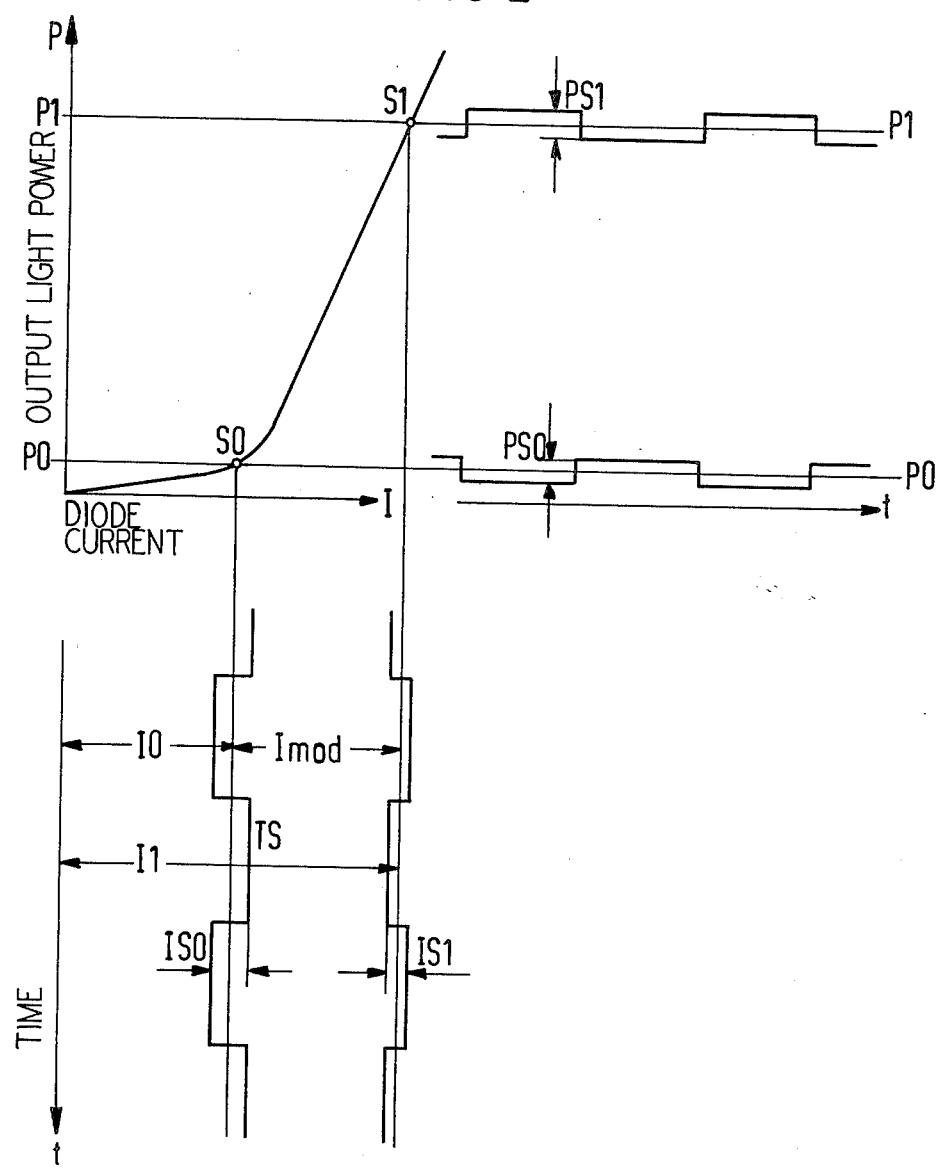
FIG. 2 is a pulse diagram for the control of the modulation current in the transmitter of FIG. 1.

FIG. 2 serves for explaining the relationships, known per se, in the modulation current control of laser diodes by a low frequency control signal having a low amplitude.

The characteristic of a laser diode, i.e. the output light power P as a function of the diode current I, is illustrated in the upper-left portion of FIG. 2. The lower limit of the laser diode drive is provided by the power P0 which marks the first bend of the characteristic, whereas the upper limit, approximately at the second bend, i.e. the maximum light power which can be emitted by the laser diode in continuous operation, lies at the level P1. The currents supplied to the laser diode are illustrated under the characteristic of the laser diode. The laser diode preconduction current is referenced with I0 and the laser diode modulation current is referenced as Imod. An overall current I1, which corresponds to a light power P1, derives from both of these currents.

Additionally illustrated are two control signals IS0 and IS1, of which one is superposed at the lower limit and the other is superposed at the upper limit of the modulation current. The superposition occurs in the second modulator or mixer M2, and the period of the low frequency signal Ts supplied to the modulator M2 is retained in the superposition.

The light power emitted by the laser diode is illustrated to the right of the laser diode characteristic. The two portions of the control signal produce light power levels PS0 or, respectively, PS1, which fluctuate about the laser diode quiescent power level P0 or, respectively, about the maximum drive level P1.

For regulation, the control signal contained in the light signal is supplied to the mixer M1. A mixing with the output signal of the modulator/oscillator FM0 occurs, whereby only a direct voltage arises in the steady state. The output signal of the mixer M1 is compared to the second reference voltage Ur2 and the resulting direct voltage is employed, after amplification, for the control of the source QM for the modulation current.

Given the use of a bipartite control signal, the difference PS1−PS0 is employed for regulation, and the regulation consists in maintaining the difference at a constant.

For simplification, one can eliminate the second portion IS1 of the control signal. In this case, the amplitude of the light power PS0 is supplied to the second comparator V2. The regulation then occurs in such a manner that the light power level PS0 remains constant since, given too great a light power level PS0, the operating point is shifted to a higher value and, given too low a light power level PS0, the same is shifted to too low a value.

After the presentation of the control operation, in the circuit according to FIG. 1, the manner of operation of the circuit will be explained in conjunction with the transmission of telemetry data. In FIG. 3a, these telemetry data are illustrated in the form of a six bit NRZ-PCM word. After a frequency modulation in the frequency modulator FM0, a signal occurs corresponding to that in FIG. 3b in which the frequency fs of the low frequency signal is increased or, respectively, reduced by a specific amount Δf. After superposition of the signal on the modulation signal, a curve corresponding to FIG. 3c occurs, whereby, in view of the lower steepness of the laser diode characteristic at the point S0 of FIG. 2, the component of the control signal effective at the point S0 has received a greater amplitude than the component effective at the point S1, i.e. a predistortion has been undertaken for the purpose of steepness compensation.

The light p emitted by the laser diode is illustrated in FIG. 3d, and it can be seen that the two components PS1 and PS0 of the control signal exhibit approximately equal amplitudes. After the differential formation, the control signal then disappears, so that no manipulated variable exists for changing the modulation signal emitted by the source QM so that the control, therefore, is in its steady state. In FIGS. 2 and 3, the components of the control signal are illustrated enlarged relative to the modulation current for the purpose of illustration; in practice, the amplitude of the control signal is lower than that of the modulation signal by at least a power of 10.

Figure 4:
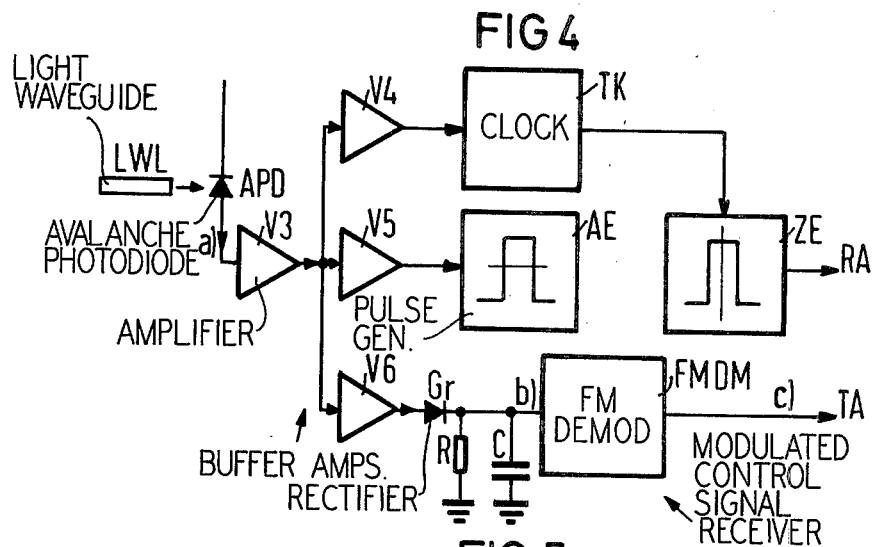
FIG. 4 is a schematic block diagram of an optical receiver of an optical transmission system constructed in accordance with the present invention.

According to FIG. 3d, the light emitted by the laser diode to the transmission link contains the control signal modulated with telemetry data. Referring to FIG. 4, at the end of the light wave guide LWL, which may correspond to the light wave guide A of FIG. 1, the transmitted light is picked up in an optical receiver by an avalanche photodiode APD and is converted into a corresponding electrical signal which is amplified in a photodiode amplifier V3 specially matched to the photodiode APD. A clock circuit TK for generating the bit clock of the transmitted digital signal, a pulse generator AE, and a receiver for the modulated control signal are connected via buffer amplifiers V4, V5 and V6 to the output of the photodiode amplifier V3. The clock circuit TK and the pulse generator AE having an amplitude discriminator and a time discriminator correspond to standard device for digital signals having a comparable bit rate connected above copper cable. At its input side, the receiver for the modulated control signal comprises a rectifier GR which is connected to an RC element for peak value rectification. The time constant of the peak value rectification is thereby dimensioned in such a manner that it can follow the low frequency control current but not the higher frequency useful signal. An FM demodulator FMDM follows the rectification circuit and thereby provides the telemetry data for further processing at its output.

Figure 5A:
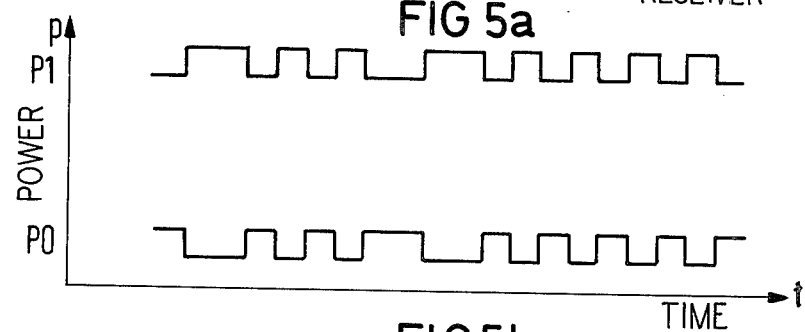
FIGS. 5a, 5b and 5c, is a pulse diagram relating to the operation of the receiver of FIG. 4.
Figure 5B:
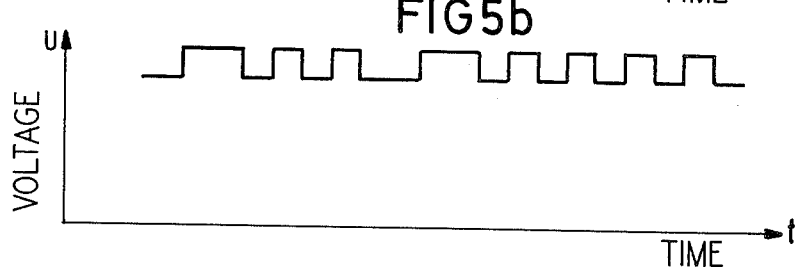
Figure 5C:
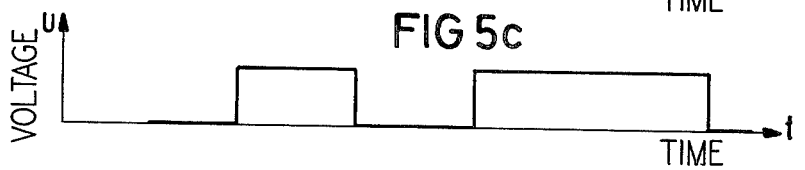

Referring to the pulse diagram of FIG. 5, the received light power with the two portions of the modulated control signal corresponding to FIG. 3d is illustrated in FIG. 5a. The voltage progression illustrated in FIG. 5b occurs at the capacitor C after the peak value rectification, the voltage progression illustrating the modulated control signal together with a constant component. After the FM demodulation, the signal progression illustrated in FIG. 5c occurs, this corresponding to the telemetry signal according to FIG. 3a.

In a further embodiment of the invention, which is not illustrated on the drawing, a low pass filter is contained in the receiver instead of the peak value rectification circuit. In view of the high frequency spacing between the control signal and the useful signal in the present case, such a low pass filter can be easily constructed.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. An optical signal transmitter for transmitting a data signal and an auxiliary signal, comprising:
    a laser diode;
    a first adjustable current source connected to said laser diode for supplying a preconduction current thereto;
    a first control loop comprising
    a photodiode light-coupled to said laser diode, and
    a first comparator including a first input connected to a first reference voltage, a second input connected to said photodiode and an output connected to said first adjustable current source for regulating the preconduction current; and
    a second control loop comprising modulation means including an oscillator for providing a low frequency signal as the auxiliary signal, a data signal input, a modulator for modulating the low frequency signal with the data signal, and an output,
    a first mixer including a first input connected to said output of said modulation means, a second input connected to said photodiode, and an output;
    a second comparator including a first input connected to a second reference voltage, a second input connected to said output of said first mixer and an output,
    a second adjustable current source for supplying modulation current for said laser diode, connected to said output of and controlled by said second comparator, and
    a second mixer including a first input connected to said output of said modulation means, a second input connected to said second adjustable current source, and an output connected in common with said first adjustable current source and said laser diode.

2. The signal transmitter of claim 1, wherein: said first comparator comprises a differential amplifier.

3. The signal transmitter of claim 1, wherein: said second comparator comprises a differential amplifier.

4. The signal transmitter of claim 1, wherein: said modulator comprises:
    an FM modulator.

5. The signal transmitter of claim 1, wherein: said modulator comprises:
    a pulse code modulator.

6. The signal transmitter of claim 1, wherein: said modulator comprises:
    a delta modulator.

7. The signal transmitter of claim 1, wherein: said modulator comprises:
    an angular modulator.

* * * * *